United States Patent
Ito et al.

(10) Patent No.: US 10,545,404 B2
(45) Date of Patent: Jan. 28, 2020

(54) METHOD FOR MANUFACTURING PATTERN-FORMED BODY

(71) Applicant: DEXERIALS CORPORATION, Shinagawa-ku, Tokyo (JP)

(72) Inventors: Makiya Ito, Tokyo (JP); Ryosuke Endo, Tokyo (JP); KyungSung Yun, Tokyo (JP); Hirofumi Kondo, Tokyo (JP)

(73) Assignee: DEXERIALS CORPORATION, Shinagawa-Ku, Tokyo (JP)

( * ) Notice: Subject to any disclaimer, the term of this patent is extended or adjusted under 35 U.S.C. 154(b) by 17 days.

(21) Appl. No.: 14/897,478

(22) PCT Filed: Jun. 6, 2014

(86) PCT No.: PCT/JP2014/065065
§ 371 (c)(1),
(2) Date: Dec. 10, 2015

(87) PCT Pub. No.: WO2014/199910
PCT Pub. Date: Dec. 18, 2014

(65) Prior Publication Data
US 2016/0124305 A1 May 5, 2016

(30) Foreign Application Priority Data
Jun. 11, 2013 (JP) ................................. 2013-122812

(51) Int. Cl.
*G03F 7/038* (2006.01)
(52) U.S. Cl.
CPC .................................. *G03F 7/038* (2013.01)
(58) Field of Classification Search
CPC ..................................................... G03F 7/038
See application file for complete search history.

(56) References Cited

U.S. PATENT DOCUMENTS

| | | | |
|---|---|---|---|
| 7,749,684 B2* | 7/2010 | Kobayashi | B82Y 30/00 430/311 |
| 8,703,839 B2* | 4/2014 | Takihara | C08F 220/20 520/1 |

(Continued)

FOREIGN PATENT DOCUMENTS

| | | |
|---|---|---|
| JP | 2005-052686 A | 3/2005 |
| JP | 2005-189631 A | 7/2005 |

(Continued)

OTHER PUBLICATIONS

International Search Report (PCT/ISA/210) datd Sep. 2, 2014, by the Japanese Patent Office as the International Searching Authority for International Application No. PCT/JP2014/065065.

(Continued)

*Primary Examiner* — Sanza L. McClendon
(74) *Attorney, Agent, or Firm* — Buchanan, Ingersoll & Rooney PC

(57) ABSTRACT

To provide a production method of a pattern-formed body, which can simply provide a pattern with surface free energy differences. A cured resin layer, to which a pattern of a master (20) has been transferred, is formed on a base (11), by applying a resin composition (12) containing a first compound exhibiting low surface free energy, and a second compound exhibiting surface free energy higher than the surface free energy of the first compound, on the base (11), and curing the resin composition (12) with bringing the resin composition into contact with a master (20), to which a pattern has been formed with surface free energy differences.

12 Claims, 4 Drawing Sheets

(56) References Cited

U.S. PATENT DOCUMENTS

2008/0167396 A1    7/2008  Murao
2010/0246014 A1    9/2010  Asahi et al.
2010/0316849 A1*  12/2010  Millward .............. B81C 99/009
                                                     428/195.1

FOREIGN PATENT DOCUMENTS

JP      2007-164070 A    6/2007
JP       2011-14829 A    1/2011

OTHER PUBLICATIONS

Written Opinion (PCT/ISA/237) dated Sep. 2, 2014, by the Japanese Patent Office as the International Searching Authority for International Application No. PCT/JP2014/065065.

Extended Search Report issued by the European Patent Office in corresponding European Patent Application No. 14810216.3 dated Dec. 8, 2016 (7 pages).

* cited by examiner

METHOD FOR MANUFACTURING PATTERN-FORMED BODY

TECHNICAL FIELD

The present invention relates to a production method of a pattern-formed body having a pattern of different surface free energy. The present application claims a priority based on Japanese Patent Application No. 2013-122812 applied in Japan on Jun. 11, 2013, which is incorporated herein by reference.

BACKGROUND ART

Currently, most of fine patterns for electronic circuits in semiconductor devices, displays, or electronic products are produced by photolithography, but there is a limit to produce inexpensive product with photolithography. In production of electronics products aiming to give a large area, it is difficult to suppress production cost with a production method using lithography.

Considering the aforementioned trends, so-called "printed electronics," which produces electronic circuits, sensors, or elements utilizing printing techniques, has been studied. This method has attracted attentions as a production method, which can reduce a usage amount of chemical substances, and is friendly to the global environment. Moreover, part of this method has already applied for electrode printing of a membrane keyboard, automobile windshield defogger, or RFID (Radio Frequency Identification) tag antenna.

PTL 1 discloses an intaglio for transferring, surface tension of which is partially reduced. PTL 2 discloses surface modification, which induces a difference in surface free energy, performed on a base.

According to the technique of PTL 1, however, it is necessary to segregate a material having low surface tension in part of the printed surface every time transfer is performed. According to the technique disclosed in PTL 2, moreover, a formation method is complicated, as a surface modification of a base is carried out using a mask pattern.

CITATION LIST

Patent Literature

PTL 1: Japanese Patent Application Laid-Open (JP-A) No. 2007-164070
PTL 2: JP-A No. 2005-52686

SUMMARY OF INVENTION

Technical Problem

The present invention is proposed based on the aforementioned current situations in the art, and provide a production method of a pattern-formed body, which can easily attain a pattern of different surface free energy.

Solution to Problem

In order to solve the aforementioned problems, a production method of a pattern-formed body of the present invention includes:
applying a resin composition, which contains a first compound exhibiting low surface free energy, and a second compound exhibiting surface free energy higher than the surface free energy of the first compound, onto a base; and curing the resin composition with bringing the resin composition into contact with a master, to which a pattern has been formed with surface free energy differences, to thereby form, on the base, a cured resin layer to which the pattern of the master has been transferred.

Moreover, the pattern-formed body of the present invention is formed by the aforementioned production method.

Furthermore, the resin composition for transferring surface free energy of the present invention includes:
a first compound exhibiting low surface free energy;
a second compound exhibiting surface free energy higher than the surface free energy of the first compound; and
a photopolymerization initiator,
wherein the first compound contains perfluoropolyether-containing acrylate.

Advantageous Effects of the Invention

The present invention can easily attain a pattern of different surface free energy, which is formed by transferring a pattern of a master, without a complicated process, such as lithography.

DESCRIPTION OF EMBODIMENTS

The embodiments of the present invention are specifically described in the following order with reference to drawings, hereinafter.
1. Production method of pattern-formed body
2. Pattern-formed body
3. Examples

1. Production Method of Pattern-Formed Body

The production method of a pattern-formed body according to one embodiment of the present invention includes: applying a resin composition, which contains a first compound exhibiting low surface free energy, and a second compound exhibiting surface free energy higher than the surface free energy of the first compound, onto a base; and curing the resin composition with bringing the resin composition into contact with a master, to which a pattern has been formed with surface free energy differences, to thereby form, on the base, a cured resin layer to which the pattern of the master has been transferred.

Each step is described through FIGS. 1 and 2 hereinafter. Note that, in FIGS. 1 and 2, the fluororesin-based compound is listed as an example of the first compound, but the first compound is not limited to the fluororesin-based compound.

Figure 1:
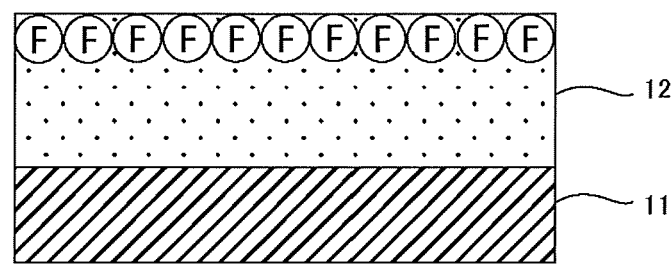
FIG. 1 is a cross-sectional view illustrating an outline of the coating step.

FIG. 1 is a cross-sectional view illustrating an outline of a coating step. The coating step contains applying a resin composition 12 onto a base 11. As for coating, a bar coater, a spray coater, or a spin coater can be used.

The base 11 is not particularly limited, and polyethylene terephthalate (PET), glass, or polyimide can be used as the base 11. Moreover, a transparent material or an opaque material can be used as the base 11. In the case where a UV-curable resin composition is used as the resin composition 12, ultraviolet rays can be applied from the side of the base 11 by using, as the base 11, a transparent material that transmits ultraviolet rays.

The resin composition 12 contains a first compound exhibiting low surface free energy, and a second compound exhibiting surface free energy higher than the surface free energy of the first compound.

As for the first compound, a surface adjusting agent, such as so-called "an anti-blocking agent," "a slipping agent," "a leveling agent," and "an antifouling agent" can be used. The first compound is preferably a fluororesin-based compound, or a silicone resin-based compound. Examples of the fluororesin-based compound include a perfluoropolyether group-containing compound, and a perfluoroalkyl group-containing compound. Examples of the silicone resin-based compound include a polydimethylsiloxane-containing compound, and a polyalkylsiloxane-containing compound.

The second compound is not limited, as long as the second compound is a compound exhibiting surface free energy higher than the surface free energy of the first compound. In the case where a perfluoroalkyl group-containing acrylate is used as the first compound, for example, hydroxyl group-containing acrylate (e.g., pentaerythritol triacrylate, and polyethylene glycol monoacrylate) is preferably used as the second compound.

As for the resin composition 12, a fast curing radical polymerizable resin composition, or cationic polymerizable resin composition is preferably used. Other than the first compound and the second compound, the resin composition contains a polymerizable resin, and a polymerization initiator.

The radical polymerizable resin composition contains acrylate, and a radical polymerization initiator. Examples of the acrylate include pentaerythritol triacrylate, propylene glycol-modified glycerin triacrylate, ethylene glycol diacrylate, diethylene glycol diacrylate, and trimethylol propane triacrylate. These may be used alone, or in combination. Moreover, examples of the radical polymerization initiator include an alkylphenone-based photopolymerization initiator, an acylphosphine oxide-based photopolymerization initiator, and a titanocene-based photopolymerization initiator. These may be used alone, or in combination.

The cationic polymerizable resin composition contains an epoxy resin, and a cationic polymerization initiator. Examples of the epoxy resin include a bisphenol epoxy resin, a phenol novolak epoxy resin, an alicyclic epoxy resin, a heterocyclic epoxy resin, and a glycidyl ester epoxy resin. These may be used alone, or in combination. Examples of the cationic polymerization initiator include onium salts, such as an aromatic sulfonium salt, an aromatic diazenium, an iodonium salt, a phosphonium salt, and a selenonium salt. These may be used alone, or in combination.

Note that, as other compounds, the resin composition 12 may contain a viscosity modifier, a diluent, and a surface conditioner, if necessary.

Figure 2:
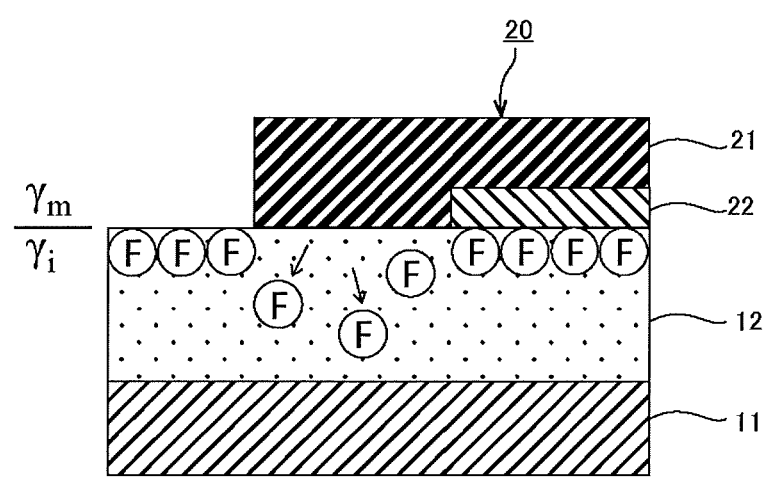
FIG. 2 is a cross-sectional view illustrating an outline of the curing step.

FIG. 2 is a cross-sectional view illustrating an outline of a curing step. In this curing step, the resin composition 12 is cured with bringing into contact with a master 20 to which a pattern is formed with surface free energy differences, to thereby form a cured resin layer to which a pattern of the master 20 has been transferred, on the base 11.

The master 20 contains a higher surface free energy region 21 and a low surface free energy region 22 at the surface thereof. For example, the high surface free energy region 21 is a region of glass, metal, or silicon, and the low surface free energy region 22 is a region of a fluorine coating, a silicone coating, nitrogen, argon, or air (a space).

The base of the master 20 is preferably glass to which fluorine coating is easily performed. Moreover, the surface of the master 20 is preferably smooth. As a result, surface migrations of the first compound and the second compound become easy, and a surface of the cured resin layer can be made smooth.

In the case where the master 20 is brought into contact with the resin composition 12, as illustrated in FIG. 2, the state of the interface between the master 20 and the resin composition 11 is that the first compound at the surface of the resin composition 12 moves to the low surface free energy region 22 of the master 20, and the second compound moves to the high surface free energy region 22, as ΔY specified by the following formula (1) tries to be small.

$$\Delta Y = Y_m - Y_i \quad (1)$$

In the formula (1) above, $Y_m$ is surface free energy of the surface of the master 20, and $Y_i$ is surface free energy of the surface of the resin composition 12.

Accordingly, for example, the fluororesin-based compound moves to the low surface free energy region 22, such as a fluorine coating region, and is removed from an interface of the high surface free energy region 21, as illustrated in FIG. 2. Then, the resin composition 12 is cured in the state where the master 20 is in contact with the resin composition 12, to thereby form a cured resin layer, to which the pattern of the master 20 has been transferred, on the base 11. The curing method of the resin composition 12 is appropriately selected depending on a type of the resin for use. For example, energy line (e.g., heat, and ultraviolet rays) irradiation can be used.

Moreover, the production method preferably further includes, after the curing step, applying an ink composition onto the cured resin layer, and curing the ink composition. As for the ink composition, for example, a composition, which has the same formulation to that of the resin composition 12, with proviso that the first compound is removed, can be used.

As described above, a pattern of the surface free energy differences of the master 20 can be repeatedly transferred by using the master 20. Moreover, the transferred pattern of the surface free energy differences is excellent in terms of fine pitch, and size stability. Moreover, the cured coating film thereof has excellent transparency.

2. Pattern-Formed Body

Figure 3:
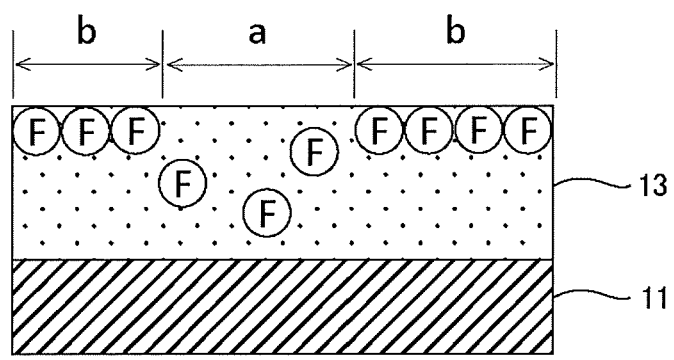
FIG. 3 is a cross-sectional view illustrating one example of the pattern-formed body.

Next, the pattern-formed body formed by the aforementioned production method is described. FIG. 3 is a cross-sectional view illustrating one example of the pattern-formed body. The pattern-formed body contains, on the base 11, a cured resin layer 13, a surface of which has a high surface free energy region a and a low surface free energy region b.

The base 11 is identical to the base used for the aforementioned production method of a pattern-formed body, and the cured resin layer 13 is a cured product of the resin composition 12 used for the aforementioned production method of a pattern-formed body.

The pattern-formed body according to the present embodiment can provide a smooth pattern surface through smoothing of a transfer surface of the master 20. Then, a processed pattern having fine pitches and excellent size stability can be attained by processing the smooth pattern surface with an ink composition or the like. Accordingly, the pattern-formed body can be applied for the electronic field, such as electronic circuit patterns, or a biomedical field, such as DNA chips.

EXAMPLES

3. Examples

Examples of the present invention are specifically described hereinafter. In Examples, Master A, on which a pattern was formed with surface free energy differences, Master B, which had low surface free energy over the entire surface thereof, Master C, which had high surface free energy over the entire surface thereof, were produced, and the pattern was transferred to a resin composition using each of the masters. Note that, the present invention is not limited to these examples.

As for the exposure devices, contact angle gauge, microscope, and atomic force microscope (AFM), the following devices were used.
Exposure Device A: Mask Aligner MA-20 (manufactured by MIKASA CO., LTD.)
Exposure Device B: Alignment exposure device (manufactured by Toshiba Lighting & Technology Corporation)
Contact Angle Gauge: DM-701 (manufactured by Kyowa Interface Science Co., Ltd.)
Microscope: VHX-1000 (manufactured by Keyence Corporation)
AFM: SPA400 (manufactured by Hitachi High-Tech Science Corporation)
[Production of Master A]

A negative photoresist (product name: OFPR-800LB, manufactured by Tokyo Ohka Kogyo Co., Ltd.) was applied onto a glass substrate in the size of 10 cm×10 cm by spin coating, and the applied photoresist was dried for 90 seconds at 110° C. on a hot plate. The substrate coated with the photoresist, and a photomask, to which lines and spaces of 5 μm had been patterned, were set, and subjected to exposure by means of Exposure Device 1. After the exposure, the substrate was immersed in a 2.38% tetramethyl ammonium hydroxide aqueous solution for 1 minute, and then was immersed in pure water for 1 minute, followed by drying at room temperature, to thereby perform developing.

The developed substrate was washed with pure water, and then with a cleaning fluid (product name: Novec7300, manufactured by 3M Company) in this order. Thereafter, a fluorine coating agent (product name: DURASURF DS-5210F, manufactured by HARCES Co., Ltd.) was applied onto the substrate by dropwise. After leaving to stand overnight, the resultant was washed with a cleaning fluid (product name: Novec7300, manufactured by 3M Company). Thereafter, a fluorine coating agent (product name: DURASURF DS-5210F, manufactured by HARCES Co., Ltd.) was applied thereon dropwise. The resultant was further left to stand overnight, and then washed with a cleaning fluid (product name: Novec7300, manufactured by 3M Company), followed by drying at room temperature.

Figure 4:
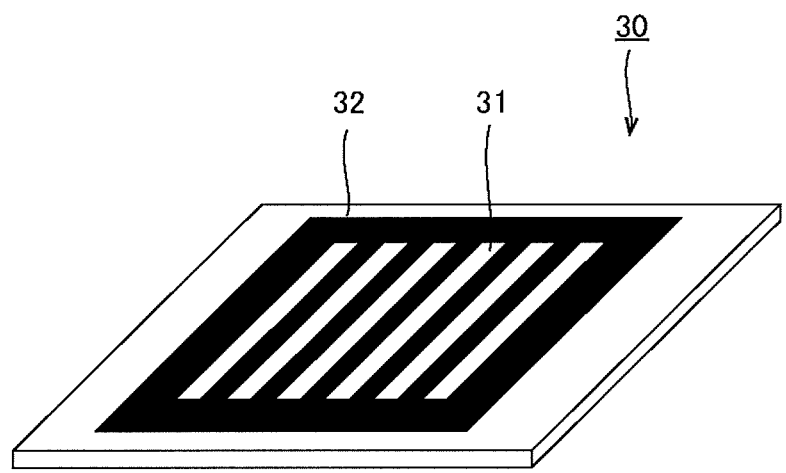
FIG. 4 is a perspective view illustrating an outline of Master A in Examples.

The resulting substrate was immersed in a stripping solution for 5 minutes to remove the remaining resist film, and then washed with acetone, and with a cleaning fluid (product name: Novec7300, manufactured by 3M Company) in this order. As a result, Master A, in which the high surface free energy region 31 and the low surface free energy region 32 had been patterned (partially fluorine coated) on the glass substrate 30, as illustrated in FIG. 4, was obtained.
[Production of Master B]

A microscope slide in the size of 7 cm×5 cm was washed with a cleaning fluid (product name: Novec7300, manufactured by 3M Company). Thereafter, a fluorine coating agent (product name: DURASURF DS-5210F, manufactured by HARCES Co., Ltd.) was applied onto the microscope slide dropwise. After leaving the resulting slide to stand overnight, the slide was washed with a cleaning fluid (product name: Novec7300, manufactured by 3M Company). Thereafter, a fluorine coating agent (product name: DURASURF DS-5210F, manufactured by HARCES Co., Ltd.) was applied onto the microscope slide dropwise. After leaving the resulting slide to stand overnight, the slide was washed with a cleaning fluid (product name: Novec7300, manufactured by 3M Company), to thereby obtain Master B (entire surface of which was coated with fluorine).
[Production of Master C]

A fresh microscope slide in the size of 7 cm×5 cm was provided as Master C.
[Preparation of Resin Composition]

In Table 1, formulation (part(s) by mass) of Resin Composition A for a cured resin layer, and Resin Composition B for a processing layer are presented.

TABLE 1

|  | Resin Composition A | Resin Composition B |
| --- | --- | --- |
| TMM-3 | 80 | 80 |
| OTA-480 | 15 | 15 |
| AE-400 | 5 | 5 |
| X-71-1203 | 1 | 0 |
| IRGACURE 184 | 3 | 3 |

TMM-3: pentaerythritol triacrylate, manufactured by Shin-Nakamura Chemical Co., Ltd.
OTA-480: propylene glycol-modified glycerin acrylate, manufactured by Daicel SciTech Co., Ltd.
AE-400: polyethylene ethylene glycol monoacrylate #400, manufactured by NOF Corporation
X-71-1203: perfluoropolyether-containing acrylate, manufactured by Shin-Etsu Chemical Co., Ltd.
IRGACURE 184: manufactured by BASF

[Formation of Cured Resin Layer]

Figure 5:
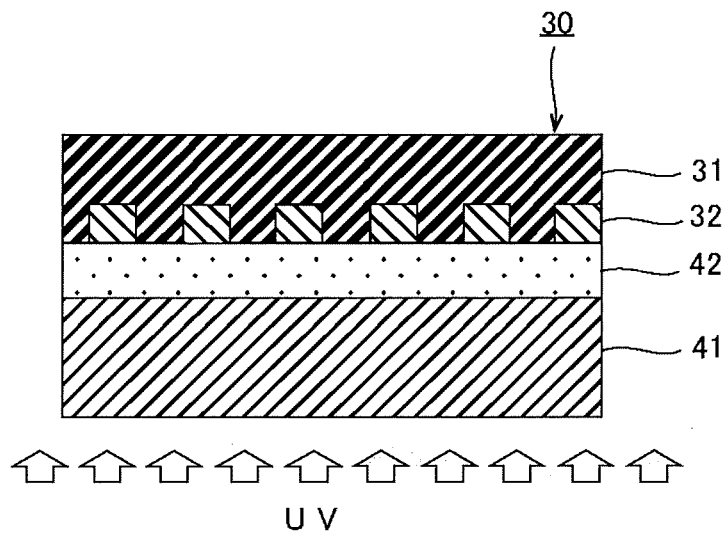
FIG. 5 is a cross-sectional view illustrating an outline of a curing step including curing Resin Composition A using Master A.

FIG. 5 is a cross-sectional view illustrating an outline of the curing step where Resin Composition A was cured using Master A. As illustrated in FIG. 5, Resin Composition A 42 was applied (wet film thickness: 8 μm) onto a PET film 41 by a bar coater. The applied Resin Composition A was brought into close contact with Master A 30, and then cured by exposing the PET surface to light by means of Exposure Device B. The radiation dose of the exposure was 6 J/cm². The film was peeled from Master A, to thereby obtain Coating Film A, in which the cured resin layer had been formed on the PET film 41.

Moreover, Master B and Master C were also brought into contact with Resin Composition A, and Resin Composition A was cured in the same manner as described above, to thereby obtain Coating Film B and Coating Film C.

[Evaluation of Surface Free Energy]

A contact angle of Coating Film B and a contact angle of Coating Film C were measured with the coating angle gauge, and each surface free energy was calculated in accordance with Kaelble-Wu method. The contact angles and surface free energy of Coating Film B and Coating Film C are presented in Table 2.

TABLE 2

| Film | Master used | Water contact angle (°) | Hexadecane contact angle (°) | Surface free energy (mJ/m$^2$) |
|---|---|---|---|---|
| Coating Film C | C | 51 | 5 | 51.3 |
| Coating Film B | B | 110 | 55.5 | 17.3 |

As presented in Table 2, the coating surface had low surface free energy, when Master B that was fluorine-coated glass was used, and the coating surface had high surface free energy when Master C that was glass was used. Specifically, it was found that the surface free energy of the master was transferred to Resin Composition A.

Processing Example 1

In Processing Example 1, Coating Film A, which was prepared by curing Resin Composition A using Master A, was painted with an oil-based ink pen. Then, the deposition state of the ink was observed. As for the oil-based ink pen, a commercially available pen, "Mackee" manufactured by ZEBRA CO., LTD. was used.

Figure 6:
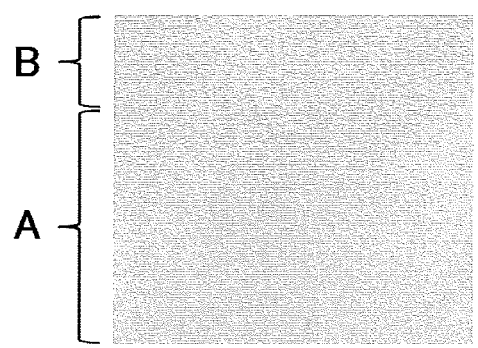
FIG. 6 is a photomicrograph of a surface of Coating Film A.
Figure 7:
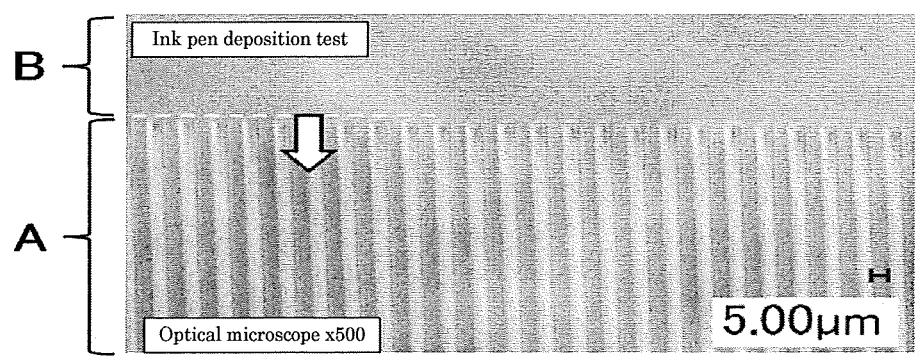
FIG. 7 is a photomicrograph of the surface of Coating Film A, which is painted with an oil-based ink pen.

FIG. 6 is a photomicrograph of the surface of Coating Film A, and FIG. 7 is a photomicrograph where the surface of Coating Film A is painted with an oil-based ink pen. As illustrated in FIG. 6, the appearance of the surface of the coating film just after the transferring was colorless transparent. In the case where the area of the region A illustrated in FIG. 6 was painted with the oil-based ink pen, the ink was not deposited on the area having low surface free energy, which was corresponded to the area of Master A coated with fluorine, and the ink was deposited on the area having high surface free energy, which was corresponded to the area of Master A not coated with fluorine. Meanwhile, the region B, which was not painted with oil-based ink pen, illustrated in FIG. 7, was colorless transparent, similarly to the surface of the coating film just after the transferring, illustrated in FIG. 6. Specifically, it was found that the appearance of the surface of the coating film just after the transferring, illustrated in FIG. 6, was colorless transparent, but the pattern of Master A was formed with surface free energy differences on the surface of the coating film.

In the case where the entire surface of Coating Film A was painted with the oil-based ink pen, moreover, the 5 μm-width pattern of Master A could be printed. In the case where Master A was repeatedly used 5 times, similarly, the pattern of Master A could be printed.

Processing Example 2

In Processing Example 2, Resin Composition B was applied on a cured resin layer, which was prepared by curing Resin Composition A using Master A, and Resin Composition B was cured. First, Resin Composition B was applied on Coating Film A, which was prepared by curing Resin Composition A using Master A, by means of a bar coater to give a wet film thickness of 1.5 μm. Then, the resultant was subjected to exposure in a nitrogen atmosphere by means of Exposure Device 2 at the radiation dose of 1.5 J/cm$^2$.

Figure 8:
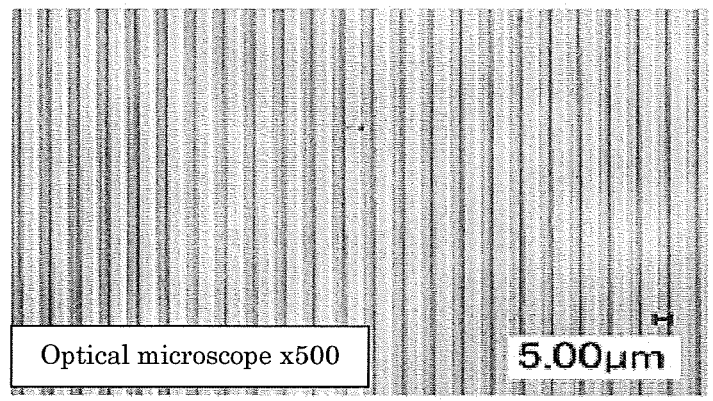
FIG. 8 is a photomicrograph where Resin Composition B is applied and cured on the surface of Coating Film A.
Figure 9:
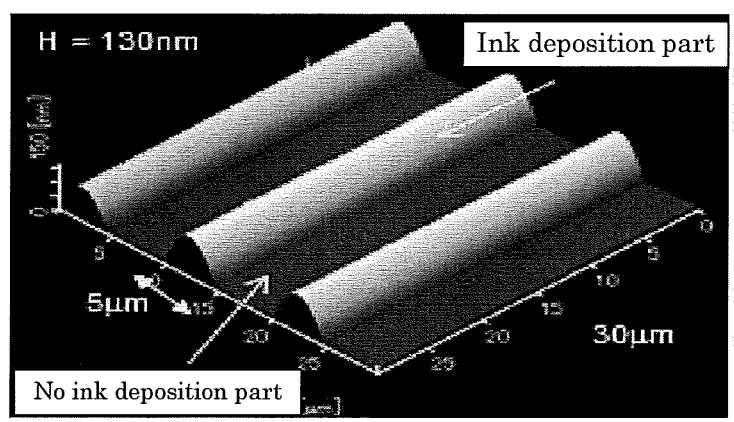
FIG. 9 is an AFM image where Resin Composition B is applied and cured on the surface of Coating Film A.

FIG. 8 is a photomicrograph where Resin Composition B is applied and cured on the surface of Coating Film A, and FIG. 9 is an AFM image where Resin Composition B (ink) was applied and cured on the surface of Coating Film A. As illustrated in FIGS. 8 and 9, the ink deposition parts, and non-ink deposition parts were observed at the linear width of 5 μm, which was corresponded to the pattern of Master A. In the case where the entire surface of Coating Film A was coated with Resin Composition B, moreover, Resin Composition B could be selectively applied according to the 5 μm-width pattern of Master A.

As described above, the pattern of the master is transferred by curing the resin composition containing the first compound exhibiting low surface free energy, and the second compound exhibiting surface free energy higher than the surface free energy of the first compound, in contact with the master to which a pattern has been formed with surface free energy differences, and a coating film having a pattern of surface free energy, which have fine pitches, and excellent size stability, can be attained.

Moreover, a pattern having excellent size stability and reproducibility can be attained by performing secondary processing, which includes further applying and curing an ink, such as a resin composition, on the coating film.

REFERENCE SIGNS LIST

11: base,
12: resin composition,
20: master,
21: high surface free energy region,
22: low surface free energy region,
30: glass substrate,
31: high surface free energy region,
32: low surface free energy region,
41: PET film,
42: resin composition A

The invention claimed is:

1. A production method of a pattern-formed body, comprising:
    applying an ultraviolet rays curable resin composition, which contains a polymerizable resin, a radical photopolymerization initiator, a first compound exhibiting low surface free energy, and a second compound exhibiting surface free energy higher than the surface free energy of the first compound, onto a base; and
    contacting the ultraviolet rays curable resin composition with a master, to which a pattern has been formed with surface free energy differences, the curing the ultraviolet rays curable resin composition by irradiation with ultraviolet rays, to thereby form, on the base, a cured resin layer to which the pattern of the master has been transferred,
    wherein the master contains a higher surface free energy region which has higher surface free energy than surface free energy of a low surface free energy region, and the low surface free energy region which has lower surface free energy than surface free energy of the higher surface free energy region at the surface thereof,
    wherein the surface free energy differences is based on the higher surface free energy region and the low surface free energy region, and
    wherein the higher surface free energy region is a region of glass, metal, or silicon.

2. The production method of a pattern-formed body according to claim 1, wherein the first compound is a fluororesin-based compound, or a silicone resin-based compound.

3. The production method of a pattern-formed body according to claim 1, wherein the resin composition is a radical polymerizable resin composition.

4. The production method of a pattern-formed body according to claim 1, wherein a base of the master is glass.

5. The production method of a pattern-formed body according to claim 1, wherein a surface of the cured resin layer is smooth.

6. The production method of a pattern-formed body according to claim 1, further comprising applying an ink composition onto the cured resin layer, and curing the ink composition.

7. A resin composition for transferring surface free energy, comprising:
a first compound exhibiting low surface free energy;
a second compound exhibiting surface free energy higher than the surface free energy of the first compound; and
a photopolymerization initiator,
wherein the first compound contains perfluoropolyether-containing acrylate, and
wherein the second compound contains hydroxyl group-containing acrylate and the hydroxyl group-containing acrylate contains polyethylene glycol monoacrylate.

8. The production method of a pattern-formed body according to claim 1,
wherein the low surface free energy region is a region of a fluorine coating, or silicone coating.

9. The production method of a pattern-formed body according to claim 1, wherein the higher surface free energy region is a region of glass or metal.

10. The production method of a pattern-formed body according to claim 1, wherein the first compound contains perfluoropolyether-containing acrylate.

11. The production method of a pattern-formed body according to claim 1, wherein the second compound contains hydroxyl group-containing acrylate.

12. The production method of a pattern-formed body according to claim 11,
wherein the hydroxyl group-containing acrylate contains at least one of pentaerythritol triacrylate or polyethylene glycol monoacrylate.

* * * * *